US006566952B1

(12) United States Patent
Allan

(10) Patent No.: US 6,566,952 B1
(45) Date of Patent: May 20, 2003

(54) OPERATIONAL AMPLIFIER WITH EXTENDED OUTPUT VOLTAGE RANGE

(75) Inventor: James D. Allan, Colorado Springs, CO (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/916,925

(22) Filed: Jul. 27, 2001

(51) Int. Cl.$^7$ ................................................. H03F 3/45
(52) U.S. Cl. ..................... 330/255; 330/253; 330/292
(58) Field of Search ................................. 330/253, 255, 330/261, 292, 252

(56) References Cited

U.S. PATENT DOCUMENTS

| 5,323,121 A | * | 6/1994 | Butler | 330/252 |
| 5,907,259 A | * | 5/1999 | Yamada et al. | 327/563 |
| 6,005,440 A | * | 12/1999 | Okamoto | 330/253 |
| 6,066,985 A | * | 5/2000 | Xu | 330/253 |

OTHER PUBLICATIONS

"Transistor–Level Simulation," © 1997 Addison Wesley Longman, Inc., 9 pages.
"Electronic Design Automation (EDA)," © 1994–2001 Sun Microsystems, Inc., 3 pages.
Spiegel, "SPICE—A Brief Overview," Oct. 1995, 15 pages.
"Avant! Corporation," © 2001 Internet Business Systems, Inc., 2 pages.
*CMOS Analog Circuit Design*, May 1999, Chapter 6, pp. 6.0–1 through 6.8–1.
Allen, "CMOS Analog Integrated Circuit Design," Aug. 2000, 4 pages.
Graeme et al., *Operational Amplifiers, Design and Applications*, © 1971 Burr–Brown Research Corporation, pp. 228–229.
Allen et al., *CMOS Analog Circuit Design*, © 1987 Holt, Rinehart & Winston, Inc., pp. 403–426.

* cited by examiner

*Primary Examiner*—Henry Choe
(74) *Attorney, Agent, or Firm*—Kevin L. Daffer; Conley, Rose P.C.

(57) ABSTRACT

An embodiment of an amplifier circuit including a power supply node and an output node is adapted to provide, during operation, an output node voltage ranging to within 0.2 volts of a power supply voltage used during the operation. An embodiment of the circuit includes a differential first stage coupled to the power supply node and providing a pair of first stage outputs for coupling to a differential second stage. In a method of providing an output voltage near the power supply voltage of an amplifier, a first stage output voltage ranging to within a transistor turn-on voltage of the power supply voltage is produced. The first stage output voltage may further be coupled to a second stage of the amplifier, where the coupling may modulate a current flow through a first pair of cascaded transistors. An output node of the amplifier may be arranged between the pair of transistors and the power supply voltage node.

22 Claims, 4 Drawing Sheets

|  | Power supply voltage = 3.3V | Power supply voltage = 2.1V |
| --- | --- | --- |
| Open loop gain | 45 dB | 10 dB |
| Phase margin | 104 degrees | 87 degrees |
| $V_{OUT}$ | 1.997 V | 1.949 V |
| I-pullup at 1.9v | 633 mA | 144 mA |
| I-pulldown at 2.1v | 676 mA | 383 mA |

Fig. 4a

| Component | Transistor width (mm) | Register value (kp) | Capacitor value (pF) |
| --- | --- | --- | --- |
| 28a, 28b, 30a, 30b | 5 |  |  |
| 32a, 32b, 34a, 34b | 8 |  |  |
| 50a | 15 |  |  |
| 40, 48a, 48b, 42a, 42b | 40 |  |  |
| 44a, 44b, 46a, 46b | 18.2 |  |  |
| 50b | 18.75 |  |  |
| 52, 54 |  | 2 |  |
| 58, 62 |  | 2 |  |
| 60, 64 |  |  | 2 |
| R1 |  | 96 |  |
| R2 |  | 144 |  |

Fig. 4b

OPERATIONAL AMPLIFIER WITH EXTENDED OUTPUT VOLTAGE RANGE

BACKGROUND OF THE INVENTION

1. Field of the Invention

This invention relates to amplifier circuits and, more particularly, to an operational amplifier which can output a voltage near the upper power supply level (e.g., $V_{DD}$).

2. Description of the Related Art

Amplifiers are often used in integrated circuit design. Even in the case of digital integrated circuits, amplifiers may be used for purposes such as providing a reference voltage for other parts of the circuit. Generally, an amplifier makes use of power from a DC power supply to produce an output signal having its voltage and/or current increased with respect to that of an input signal. Specialized amplifiers known as operational amplifiers exhibit extremely high voltage gain, high input impedance, and low output impedance. Such operational amplifiers are useful in allowing output voltages to be produced which have specific mathematical relationships to input voltages. Operations such as addition, subtraction, multiplication, division, differentiation, and integration can be realized by configuring the operational amplifier with additional circuit elements. For example, a voltage multiplier circuit can be formed using a resistor network with an operational amplifier to multiply a constant factor by an input reference voltage. In this way, a voltage reference can be made for use in an integrated circuit.

To accurately produce a desired output voltage using an operational amplifier, however, requires that the amplifier have good AC and DC characteristics. The necessary AC characteristics may include common mode rejection ratio, positive power supply rejection ratio, negative power supply rejection ratio, open loop gain and closed loop gain. The necessary DC characteristics may include high gain and sufficient current drive at the output to maintain the desired output voltage level over the range of load impedances expected. Conditions on integrated circuits are not always conducive to having desirable characteristics for an operational amplifier, however. In particular, the available power supply voltages on integrated circuits are continually being reduced. Such reduction in power supply voltage is used to reduce overall power consumption of the integrated circuit, which may be particularly important for the use of portable and other battery operated devices, and to reduce heating problems caused by increasing circuit density. Early operational amplifiers tended to use power supply voltages of ±10 volts or ±15 volts. Because of scaling of transistor geometries, however, current integrated circuits typically need power supply voltages ranging from 0 volts at the low end to upper levels as low as 3 volts, 2 volts, or less. In such cases, the external power supply voltage may be only slightly above an internal reference voltage needed for the integrated circuit. Conventional operational amplifier designs tend to show degraded performance when the output voltage needed is near the upper limit of the power supply.

It would therefore be desirable to develop an amplifier circuit with good AC characteristics even when its output voltage is near the upper limit of the power supply voltage. The desired amplifier should also be resistant to the noisy environment which may be encountered on digital integrated circuits.

SUMMARY OF THE INVENTION

The problems outlined above may be in large part solved by a method and circuit as described herein. In the method, an output voltage of an amplifier is produced at a level near the power supply voltage of the amplifier. The method may include producing a first stage output voltage ranging to within a transistor turn-on voltage of the power supply voltage. The first stage output voltage may then be coupled to a second stage of the amplifier where the coupling modulates or controls a current flow through a first pair of cascaded transistors within the second stage. The cascaded transistors may particularly be connected in a cascode configuration. The first pair of cascaded transistors may be coupled between an output node carrying the output voltage and a power supply node carrying the power supply voltage. The coupling of the first stage output voltage to the second stage may in one embodiment include coupling the first stage output voltage to an input terminal of a third transistor, where the third transistor is coupled between the power supply node and an additional pair of cascaded transistors. A gate terminal of each transistor from this additional pair of transistors may be coupled to a gate terminal of a corresponding transistor from the first pair of cascaded transistors.

In a further embodiment, the method may include stabilizing the frequency response of the amplifier with a frequency compensation network coupled between the input terminal of the third transistor and an output terminal of the third transistor. In addition to modifying a current flow through a first pair of cascaded transistors as described above, the method may further include modifying a current flow through an additional pair of cascaded transistors which is coupled between the output node and a lower power supply node carrying, e.g., a ground potential. This modification of current flow may be accomplished by coupling an additional first stage output voltage to the second stage. In an embodiment for which the current flow through the first pair of cascaded transistors is reduced, the current through the additional pair of cascaded transistors may be increased. Such an embodiment may result in the output voltage being maintained within 0.2 volts of the power supply voltage. In a further embodiment, the method may include stabilizing the frequency response of the amplifier with a frequency compensation network coupled between the output node and a terminal of one of the pair of transistors coupled between the output node and the power supply node.

An embodiment of an amplifier circuit which may be used to implement a method such as that described above may include a differential first stage coupled to the power supply node and providing a pair of first stage outputs for coupling to a differential second stage. Each of the first stage outputs may be taken at a terminal of a respective transistor having a respective turn-on voltage. A difference between the power supply node voltage during circuit operation and an achievable voltage range of each of the first stage outputs may be less than the turn-on voltage of the respective transistor. This small difference between the power supply node voltage and the achievable voltage range of each first stage output is in contrast to the first stage output voltage ranges of some other amplifier circuits. In particular, some amplifier circuits have load transistors in the first stage constrained to operate in a mode for which the current-voltage characteristics of the transistors are relatively flat. This corresponds to operation within saturation mode for a field effect transistor. A field-effect transistor operates in saturation mode whenever the magnitude of the drain-to-source voltage for the transistor is greater than or equal to the magnitude of the gate-to-source voltage minus the threshold voltage of the transistor.

This constraining of the mode of operation of a transistor may be accomplished in some embodiments by diode-connecting the transistor. For example, the drain and gate of field effect transistor may be tied together, thereby forcing the device to be operated in saturation mode. Although diode-connecting a transistor in this manner may improve the output impedance of a given amplifier stage by forcing it to remain in an operation mode with relatively flat current-voltage characteristics, this practice provides a severe constraint on the output voltage range of the stage. In general, such a constraint forces the difference between the power supply voltage and the output voltage of such a load transistor to be at least a turn-on voltage of the transistor. In the case of a field effect transistor, a turn-on voltage corresponds to a threshold voltage of the transistor. Not diode-connecting the first stage load transistors, on the other hand, may increase the first stage gain and allow good performance even when the output of the entire amplifier is very near the power supply level.

An embodiment of the circuit described above may further include the differential second stage coupled to the power supply node and to the first stage outputs, where the second stage includes an output node and where an achievable output node voltage range during circuit operation extends to within 0.2 volts of the power supply node voltage. The second stage may further include a pair of cascaded transistors coupled between the power supply node and the output node. In an embodiment, the circuit may further include a frequency compensation network coupled between the output node and a terminal of one of the pair of transistors. Alternatively or in addition, the circuit may be adapted to provide a current of at least 50 microamperes through the pair of transistors while the output node voltage is within 0.2 volts of the power supply voltage. In an embodiment of the circuit, one of the pair of first stage outputs may be coupled to a terminal of one of the pair of transistors. The other of the pair of first stage outputs may be coupled to an input terminal of a third transistor which is coupled to the power supply node. In such an embodiment, the circuit may further include a frequency compensation network coupled between the input terminal of the third output stage transistor and an output terminal of the third output stage transistor. The third output stage transistor may further be coupled between the power supply node and a second pair of cascaded transistors. A gate terminal of each transistor from the second pair of output stage transistors may be coupled to a gate terminal of a corresponding transistor from a third pair of transistors coupled between the output node and a ground potential node.

An alternative embodiment of an amplifier circuit may include a power supply node and an output node, where the circuit is adapted to provide during operation an output node voltage ranging to within 0.2 volts of a power supply node voltage used during operation. The circuit may further include a first stage load transistor coupled to the power supply node, where the first stage load transistor is a field effect transistor not constrained by the circuit to operate in a diode-connected fashion. In addition, the circuit may include a pair of cascaded transistors coupled between the power supply node and the output node. In a further embodiment, the circuit may include a frequency compensation network coupled between the output node and a terminal of one of the cascaded transistors. Such a frequency compensation network may include a resistor and a capacitor. In an embodiment, the circuit may be adapted to provide a current of at least 50 microamperes through the pair of transistors, while the output node voltage is within 0.2 volts of the power supply node voltage.

BRIEF DESCRIPTION OF THE DRAWINGS

Other objects and advantages of the invention will become apparent upon reading the following detailed description and upon reference to the accompanying drawings in which:

FIG. 4a includes calculated performance data obtained for an amplifier similar to that of FIG. 3; and FIG. 4b includes component values used in obtaining the performance data of FIG. 4a.

Figure 1:
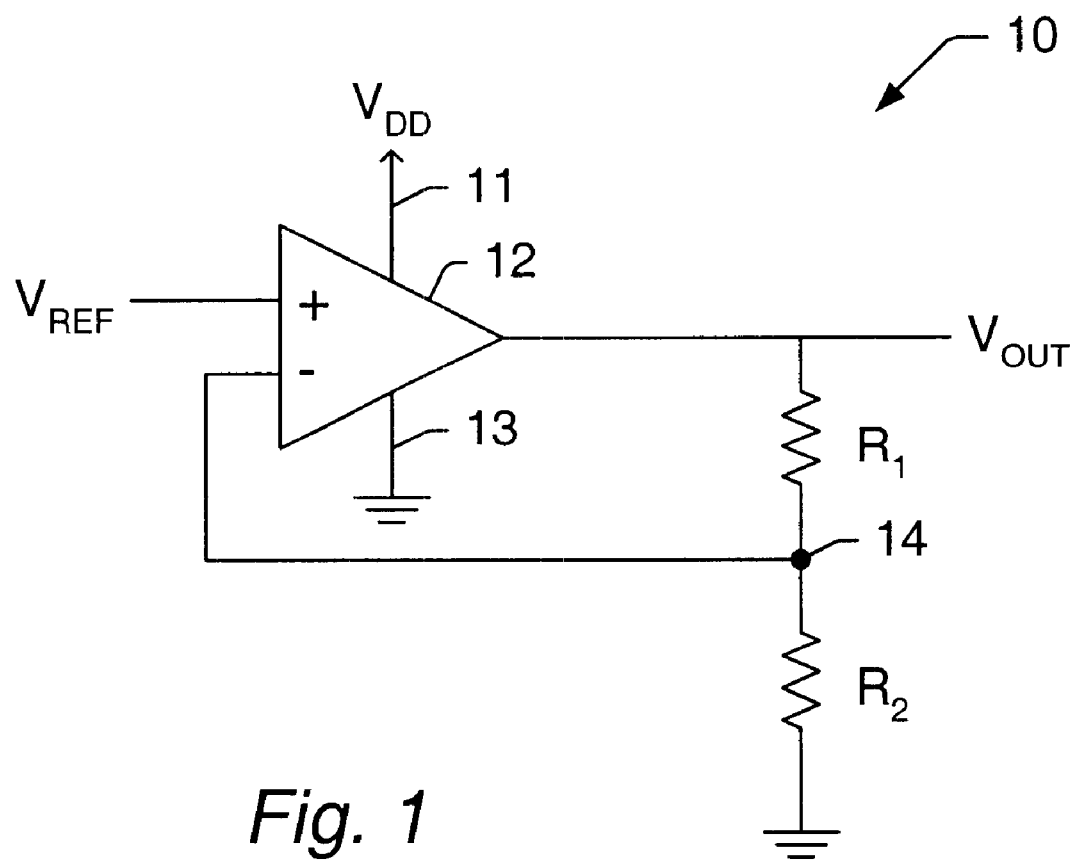
FIG. 1 is a schematic diagram illustrating use of an operational amplifier in a voltage regulator circuit.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

An exemplary embodiment of a voltage rectifier circuit is shown in FIG. 1. Operational amplifier ("op amp") 12 has reference voltage $V_{REF}$ applied to its non-inverting input. A feedback loop including resistor $R_1$ connects the output the op amp back to the inverting input. Resistor networks $R_1$ and $R_2$ form a voltage divider such that the voltage at node 14 ("$V_{14}$") is equal to $V_{OUT} \cdot R_2/(R_1+R_2)$. The output voltage $V_{OUT}$ is then equal to $V_{14} \cdot (R_1+R_2)/R_2$. As an example, if the reference voltage is a bandgap reference at 1.2 volts, $R_1$ has a resistance of 96 k$\Omega$, and $R_2$ has a resistance of 144 k$\Omega$, then the output voltage $V_{OUT}$ is 2 volts and the voltage at node 14 is 1.2 volts. Operational amplifier 12 has upper power supply connection 11 to an upper power supply $V_{DD}$ and lower power supply connection 13 which is connected to ground in this embodiment. It would be desirable for upper power supply voltage $V_{DD}$ to be as low as possible and it would further be desirable for this voltage to be very close to the output voltage in some embodiments. For an example in which $V_{OUT}$ is 2 volts, it may be desirable to have $V_{DD}$ as low as 2.1 volts.

Figure 2:
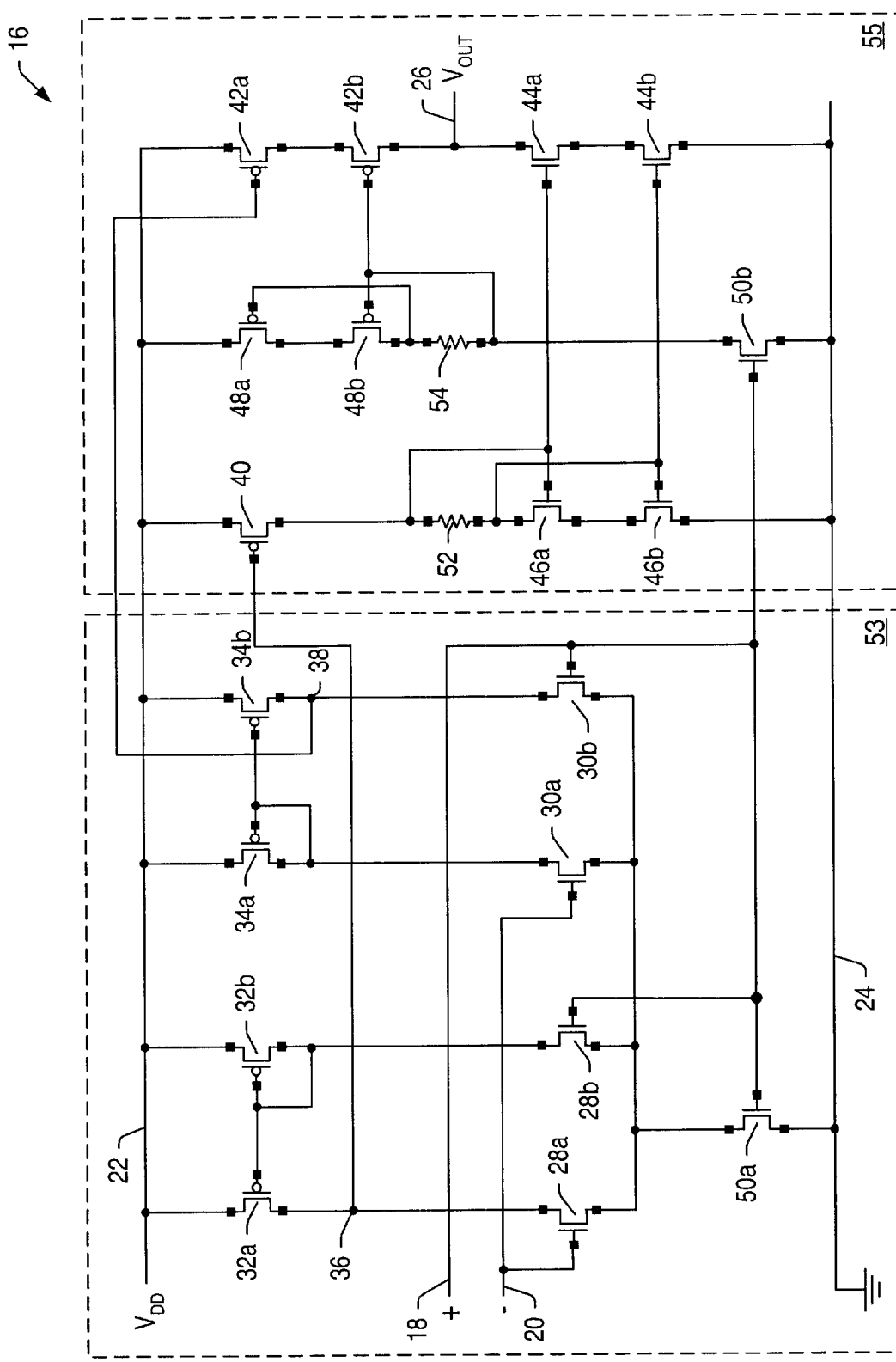
FIG. 2 is a schematic diagram of an embodiment of an amplifier described herein.

An embodiment of an amplifier circuit 16 is shown in FIG. 2. Amplifier circuit 16 may be used to implement op amp 12 within regulator 10 of FIG. 1. In the embodiment of FIG. 2, amplifier 16 is implemented in CMOS technology; however, other technologies such as bipolar or bi-CMOS may also be suitable. Amplifier circuit 16 includes upper power supply $V_{DD}$ connected to power supply node 22 which extends across the top of the circuit. Ground potential, connected to node 24, is used for the lower power supply in this embodiment. Amplifier 16 may be viewed in terms of the first stage 53 followed by a second stage 55. First stage 53 includes non-inverting input terminal 18 and inverting input terminal 20. Second stage 55 includes output node 26, where the output voltage $V_{OUT}$ is taken.

A voltage applied between input nodes 18 and 20 is connected in parallel across two input differential transistor pairs. The two transistor pairs are biased by the current mirror formed by transistors 50a and 50b. One of the differential pairs is formed by transistors 28a and 28b, while the other is formed by transistors 30a and 30b. In the embodiment of FIG. 2, the gates of transistors 50a and 50b are conveniently connected to the gates of transistors 28b and 30b. This would not need to be the case in general, however, as long as the gates of 50a and 50b are at the same potential, and the gates of 28b and 30b are at the same potential (which may be different from that of the 50a and 50b gates). The input differential pairs are formed using n-channel transistors. P-channel transistors 32a and 32b form an active load for the differential pair including transistors 28a and 28b. Similarly, p-channel transistors 34a and 34b form an active load for the input differential pair including transistors 30a and 30b. Load transistors 32a, 32b, 34a, and 34b are each connected between power supply node 22 and their respective input transistors 28a, 28b, 30a, and 30b. Transistors 32b and 34a are diode-connected by having the transistor's gate connected to its drain. This forces each of these transistors to operate at a point within the saturation region of the field effect transistor. Transistors 32a and 34b, on the other hand, are not diode-connected in this fashion. In an embodiment, the transistor sizes of 32a, 32b, 34a and 34b are equal and, separately, the sizes of 28a, 28b, 30a and 30b are equal.

First stage 53 has two output nodes 36 and 38 at which the output of the first stage is connected to the second stage. Output node 36 corresponds to the drains of both input n-channel transistor 28a and load transistor 32a. Output node 36 is connected to the gate, or the input terminal, of transistor 40 within the second stage. Output node 38 corresponds to the drains of input n-channel transistor 30b and p-channel load transistor 34b. Output 38 is connected to the gate of output stage transistor 42a. Second stage transistor 40 is a p-channel transistor connected in series with resistor 52 and cascaded n-channel transistors 46a and 46b. Transistors 46a and 46b are connected in a particular cascade arrangement called a cascode configuration, which can be viewed as a common-source/common-gate cascade. It can be seen that other transistor pairs are connected in cascode configuration in the embodiment of FIG. 2, such as transistors 48a and 48b, 42a and 42b, and 44a and 44b. The network of transistors 40, 46a, 46b, and resistor 52 in part helps to provide bias for the other n-channel transistor pair in the output stage, including transistors 44a and 44b. Since the gates of transistors 46a and 46b are connected to those of transistors 44a and 44b, respectively, the voltage applied to transistor 40 from the input stage may be used to modulate the current flow and voltage drop across n-channel transistors 44a and 44b. This modulation of the transistor pair 44a and 44b has an effect on the output voltage $V_{OUT}$ of node 26, as will be discussed further below. P-channel output stage transistor 42a and p-channel transistor 42b form a cascaded pair of transistors connected between power supply node 22 and output node 26. Transistor 42b is biased using a network including p-channel transistors 48a and 48b, resistor 54, and n-channel transistor 50b.

The fact that first stage output transistors 32a and 34b are not constrained to have equal gate and drain voltages is believed to allow an increased gain for the first stage of the amplifier, as compared to circuits in which the first stage output transistors are constrained in this way. This increased gain is believed to further allow an increased output voltage level as compared to the power supply voltage level, and an improved current drive, particularly when the output voltage is near the power supply voltage. As an example, the operation of circuit 16 is considered for an embodiment in which circuit 16 and its external circuit (not shown) are configured for output voltage $V_{OUT}$ being very near to power supply voltage $V_{DD}$. The output voltage being very near to the power supply voltage generally refers to the output voltage being near enough to the power supply voltage that conventional circuit designs do not provide good performance. For example, a circuit may not have sufficient current drive to maintain an output voltage very near the power supply voltage. In an embodiment, the output voltage being near to the power supply voltage may refer to a difference between the power supply voltage and the output voltage of less than a turn-on voltage of the transistor. In the case of a field effect transistor, the turn-on voltage corresponds to the threshold voltage of the transistor. In an embodiment, a difference in voltage of less than 0.2 volts may be achieved between the power supply voltage and the output voltage. In some cases, even smaller voltage differences may be achievable, such as a difference of approximately 0.1 volts or less.

When amplifier 16 is operated such that the output voltage $V_{OUT}$ is very near the power supply voltage $V_{DD}$, then the input nodes 18 and 20 have voltages that are also relatively near the power supply voltage. Considering as an example the circuit of FIG. 1, if a reference voltage of 1.2 volts is used at non-inverting input node 18 and a power supply voltage $V_{DD}$ of 2.1 volts is used, then under quiescent conditions, the difference between the gates of the n-channel input transistors of the first stage and the voltage $V_{DD}$ is 0.9 volts. Since load transistors 32b and 34a are diode-connected, the drop across each of these transistors is a gate-to-source voltage drop which must be at least the threshold voltage of the transistor, assuming the transistors are turned on. Since a typical threshold voltage is 0.6–0.7 volts, only about 0.2–0.3 volts is left for a drain-to-gate drop across the input n-channel transistors, and/or any gate-to-source voltage across the p-channel load transistors in excess of the threshold voltage.

Therefore, a small variation in voltage between input terminals 18 and 20 can cause the drain of one of the unconstrained load transistors 32a and 34b to move to a voltage above that of its corresponding gate. For example, slightly higher voltage at non-inverting input 18 as compared to inverting input 20 will cause transistor 30b to be turned on to a greater extent than input transistor 28a. The output of transistor 30b will, therefore, be at a lower voltage than the output of transistor 28a. Node 36 at the output of transistor 28a may, therefore, rise above the voltage of the gate of transistor 32a. Since first stage output node 36 is connected to the input of transistor 40 in the second stage, this higher voltage applied to p-channel transistor 40 may tend to cut off this transistor. The voltage at the drain of transistor 40, therefore, tends to drop which may tend to cut off the cascaded pair of n-channel transistors 46a and 46b. Since the gates of 46a and 46b are connected to transistors 44a and 44b, these transistors may also tend to be cut off and, therefore, have higher voltage drops across them. This will allow output voltage $V_{OUT}$ of output node 26 to rise higher toward power supply node 22.

At the same time, the other first stage output node 38 at the drain of load transistor 34b is at a lower voltage as compared to output node 36, as noted above. Node 38 is connected to the gate of p-channel transistor 42a. The lower voltage at node 38 increases the gate-to-source voltage for transistor 42a, thereby decreasing its drain-to-source voltage. This, again, allows the output voltage at output node 26 to rise higher toward power supply node 22. Furthermore, the increased gate-to-source voltage for transistor 42a raises the drive current of the output circuit by further turning on the transistor. This allows the current drive at output node 26 to be acceptable even when output node 26 is very close in voltage to power supply node 22. The amount of current drive needed to maintain the output voltage depends on factors such as the capacitance of the load and how much noise is encountered by the circuit. In a preferred embodiment, the current through transistors 42a and 42b is at least 50 microamperes when the output voltage is within 0.2 volts of the upper power supply voltage. This current is even more preferably greater than 100 microamperes.

Figure 3:
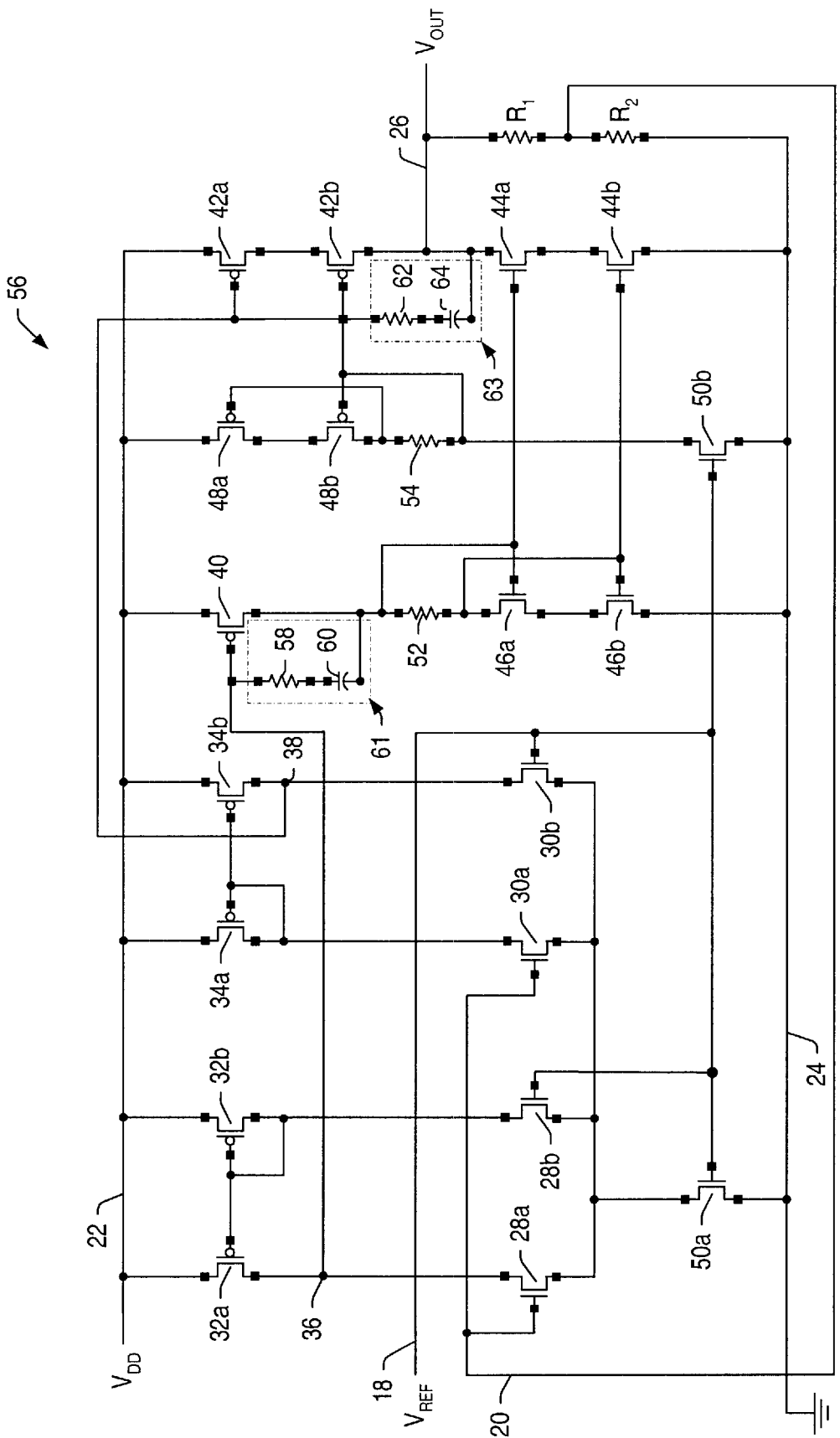
FIG. 3 is a schematic diagram of a voltage regulator circuit including an embodiment of an amplifier described herein.

In some embodiments, the increased first stage gain of amplifier circuit 16 may lead to stability problems with the circuit when operated at higher frequencies. An embodiment accounting for this potential problem is shown in FIG. 3. FIG. 3 includes voltage reference circuit 56, which includes a modified version of amplifier 16 along with an external circuit including resistors R1 and R2, as also shown in the reference circuit 10 of FIG. 1. The amplifier included in voltage reference 56 is similar to amplifier 16 of FIG. 2 with the addition of two frequency compensation networks 61 and 63. These networks are connected across transistor 40 and the transistor pair 42a and 42b, respectively. In the embodiment of FIG. 3, each frequency compensation network (i.e., networks 61 and 63) includes a resistor (such as, resistors 58 and 62, respectively) and a capacitor (such as, capacitors 60 and 64, respectively). These RC networks have the effect of gradually reducing the closed loop gain as frequency is increased. At very high frequencies, in the range of 1 GHz, the impedance of each capacitor approaches zero ohms, and the op amp exhibits no gain. Such frequency compensation may also be done in other ways, however. For example, network 63 could be connected in some embodiments across only one of transistors 42a or 42b. Furthermore, in some embodiments, frequency compensation networks 61 and 63 may be replaceable by a shunt capacitance connected between output node 26 and ground node 24.

Calculated performance for the circuit of FIG. 3 is shown in FIG. 4a. The results of FIG. 4a were obtained with a HSPICE simulation using the BSIM 3 MOSFET model. HSPICE is a workstation version of the Simulation Program for Integrated Circuits Emphasis (SPICE) developed at the University of California, Berkeley. BSIM 3 is a version of the Berkeley Short-Channel IGFET model (BSIM) where IGFET stands for Insulated Gate Field Effect Transistor. HSPICE simulation programs including the BSIM 3 model are commercially available from companies such as Avant! of Fremont, Calif. The performance measures shown in FIG. 4a were calculated using two different power supply voltages for the circuit of FIG. 3: 3.3 volts in one case and 2.1 volts in another. Open loop gain and phase margin were calculated for the amplifier alone, while output voltage $V_{OUT}$ was calculated for the voltage regulator circuit of FIG. 3 designed for an output voltage of 2 volts. Current through the pull-up and pull-down transistors of the output stage was calculated for the voltage regulator circuit as well. It can be seen from FIG. 4a that although the performance degrades when a power supply voltage of 2.1 volts is used as compared to 3.3 volts, appreciable gain, phase margin and current through the pull-up and pull-down resistors are still obtained at the 2.1-volt level. Furthermore, an output voltage of greater than 1.9 volts is obtained with the power supply voltage at 2.1 volts. The component values used in the simulation producing the data of FIG. 4a are shown in FIG. 4b.

For comparison to the results of FIG. 4a, a similar calculation was carried out using a circuit similar to that of FIG. 2, but with a simpler first stage. This simpler first stage had only one input differential pair, and the active load for that differential pair had both transistors diode-connected. One of the first stage outputs for this active load was taken at the drain of each of the diode-connected transistors. Calculation of the parameters of FIG. 4a for this simpler circuit indicates that the gain, phase margin, drive currents, and output level are all reduced as compared to those of the circuit of FIG. 3 when a power supply voltage of 3.3 volts is used. The calculations further indicate dramatically reduced performance for this simplified circuit when a 2.1-volt power supply is used. The gain is less than 0 dB in this case, so that phase margin is undefined. Furthermore, the calculated current through the pull-up resistors with the output at 1.9 volts is in the wrong direction (such that the circuit does not provide current to a load), and the calculated output level is less than 1.8 volts for the 2.0-volt voltage reference circuit.

It will be appreciated by those skilled in the art having the benefit of this disclosure that this invention is believed to provide an amplifier with extended output voltage range and a method for amplifying a voltage. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. An amplifier circuit comprising a pair of cascaded output stage transistors, which is directly coupled between a power supply node and output node, and a frequency compensation network, which is coupled between the output node and a gate terminal of one of the pair of cascaded output stage transistors, and wherein the circuit is adapted to provide during operation an output node voltage ranging to within 0.2 volts of a power supply node voltage used during said operation.

2. The circuit of claim 1, wherein the power supply node voltage is 2.1 volts, and the output node voltage is greater than 1.9 volts.

3. The circuit of claim 1, further comprising a first stage load transistor coupled to the power supply node, wherein the first stage load transistor is a field effect transistor not constrained by the circuit to operate in a diode-connected fashion.

4. The circuit of claim 1, wherein the pair of cascaded output stage transistors is in a cascode configuration.

5. The circuit of claim 1, wherein the frequency compensation network comprises a resistor and a capacitor.

6. The circuit of claim 1, wherein the circuit is adapted to provide a current of at least fifty microamperes through the pair of cascaded output stage transistors while the output node voltage is within 0.2 volts of the power supply node voltage.

7. An amplifier circuit, comprising:
a power supply node carrying a power supply node voltage; and
a differential first stage coupled to the power supply node and adapted to provide a pair of first stage outputs for coupling to a differential second stage, wherein each of the pair of first stage outputs is coupled to modulate a current flow through a pair of cascaded transistors within the differential second stage, wherein each of the first stage outputs is taken at a terminal of a respective transistor having a respective turn-on voltage, and wherein a difference between the power supply node voltage during circuit operation and an achievable voltage range of each of the first stage outputs is less than the turn-on voltage of the respective transistor.

8. The circuit of claim 7, further comprising the differential second stage coupled to the power supply node and to the first stage outputs, wherein the differential second stage includes an output node, and wherein an achievable output node voltage range during circuit operation extends to within 0.2 volts of the power supply node voltage.

9. The circuit of claim 8, wherein the differential second stage comprises the pair of cascaded transistors coupled between the power supply node and the output node.

10. The circuit of claim 9, wherein the pair of cascaded transistors is in a cascode configuration.

11. The circuit of claim 9, further comprising a frequency compensation network coupled between the output node and a terminal of one of the pair of transistors.

12. The circuit of claim 9, wherein the circuit is adapted to provide a current of at least fifty microamperes through the pair of transistors while the output node voltage is within 0.2 volts of the power supply node voltage.

13. The circuit of claim 9, wherein one of the pair of first stage outputs is coupled to a terminal of one of the pair of transistors.

14. The circuit of claim 13, wherein the other of the pair of first stage outputs is coupled to an input terminal of a third transistor coupled to the power supply node.

15. The circuit of claim 14, further comprising a frequency compensation network coupled between the input terminal of the third transistor and an output terminal of the third transistor.

16. The circuit of claim 14, wherein the third transistor is coupled between the power supply node and a second pair of cascaded transistors, and wherein a gate terminal of each transistor from the second pair of cascaded transistors is coupled to a gate terminal of a corresponding transistor from a third pair of transistors coupled between the output node and a ground potential node.

17. A method of providing an output voltage near the power supply voltage of an amplifier, said method comprising:

producing a first stage output voltage by coupling the power supply voltage to a load transistor not constrained to operate in a diode-connected fashion, wherein the first stage output voltage ranges to within a transistor turn-on voltage of the power supply voltage; and coupling the first stage output voltage to a second stage of the amplifier, wherein said coupling modulates a current flow through a first pair of cascaded transistors, and wherein the first pair of cascaded transistors is coupled between an output node carrying the output voltage and a power supply node carrying the power supply voltage.

18. The method of claim 17, further comprising modulating a current flow through a second pair of cascaded transistors by coupling an additional first stage output voltage to the second stage, wherein the second pair of cascaded transistors is coupled between the output node and a lower power supply node.

19. The method of claim 18, wherein said coupling the first stage output voltage and said modulating a current flow maintain the output voltage within 0.2 volts of the power supply voltage.

20. The method of claim 18, further comprising stabilizing a frequency response of the amplifier with a frequency compensation network coupled between the output node and a terminal of one of the second pair of cascaded transistors.

21. The method of claim 17, wherein said coupling the first stage output voltage to the second stage comprises coupling the first stage output voltage to an input terminal of a third transistor, wherein the third transistor is coupled between the power supply node and a second pair of cascaded transistors, and wherein a gate terminal of each transistor from the second pair of cascaded transistors is coupled to a gate terminal of a corresponding transistor from the first pair of cascaded transistors.

22. The method of claim 21, further comprising stabilizing a frequency response of the amplifier with a frequency compensation network coupled between the input terminal of the third transistor and an output terminal of the third transistor.

* * * * *

UNITED STATES PATENT AND TRADEMARK OFFICE
CERTIFICATE OF CORRECTION

PATENT NO. : 6,566,952 B1
DATED : May 20, 2003
INVENTOR(S) : Allan

It is certified that error appears in the above-identified patent and that said Letters Patent is hereby corrected as shown below:

Column 9,
Line 12, after the phrase "one of the pair of" please insert -- cascaded --.
Line 15, after the phrase "the pair of" please insert -- cascaded --.
Line 19, after the phrase "transistors" please insert -- cascaded --.

Signed and Sealed this

Sixteenth Day of September, 2003

JAMES E. ROGAN
*Director of the United States Patent and Trademark Office*